(12) United States Patent
Porter, Jr.

(10) Patent No.: US 10,778,222 B2
(45) Date of Patent: Sep. 15, 2020

(54) INDUCTION MEMORY CELL

(71) Applicant: Jerome Porter, Jr., Lufkin, TX (US)

(72) Inventor: Jerome Porter, Jr., Lufkin, TX (US)

(73) Assignee: Jerome Porter, Jr., Lufkin, TX (US)

( * ) Notice: Subject to any disclaimer, the term of this patent is extended or adjusted under 35 U.S.C. 154(b) by 63 days.

(21) Appl. No.: 16/186,486

(22) Filed: Nov. 10, 2018

(65) Prior Publication Data

US 2020/0153431 A1 May 14, 2020

Related U.S. Application Data

(60) Provisional application No. 62/743,561, filed on Oct. 10, 2018.

(51) Int. Cl.
| | |
|---|---|
| *H03K 17/95* | (2006.01) |
| *H02J 50/10* | (2016.01) |
| *H01F 38/14* | (2006.01) |
| *H03K 17/795* | (2006.01) |

(52) U.S. Cl.
CPC ........... *H03K 17/795* (2013.01); *H01F 38/14* (2013.01); *H02J 50/10* (2016.02)

(58) Field of Classification Search
None
See application file for complete search history.

(56) References Cited

U.S. PATENT DOCUMENTS

2005/0025480 A1\* 2/2005 Yeh .................. H01H 47/24
398/12

\* cited by examiner

*Primary Examiner* — Jared Fureman
*Assistant Examiner* — Aqeel H Bukhari

(57) ABSTRACT

The induction memory cell includes an electronic circuit that can control internally the "on" or "off" state of a magnetic field within a magnetic induction circuit. The induction memory cell can control external devices. When the induction memory cell is used in an array it can be programmed to retain binary information such as "on" as a binary digit of one or "off" as a binary digit of zero. The induction memory cell "on" or "off" state can be controlled via a one second burst of laser light, aim at one photo resistor for controlling the magnetic field "on" state in the primary coil or another photo resistor controlling the magnetic field "off" state in the primary coil. The induction memory cell requires a 1.5 volt, 5 amp power source in order to maintain an "on" or "off" switching effect in the primary coil.

3 Claims, 5 Drawing Sheets

INDUCTION MEMORY CELL

CROSS-REFERENCE TO RELATED DOCUMENT

The present application claims priority to provisional patent application No. 62/743,561, filed on Oct. 10, 2018, disclosure of which is incorporated herein at least by reference.

BACKGROUND OF THE INVENTION

1. Field of Invention

The present invention relates to a programmable solid state induction memory circuit, solid state induction storage medium for electronic devices, and solid state induction switch ("Flip Flop" circuit).

2. Discussion of the State of the Art

There are several devices that can store data, act as switches or can be programmed for digital storage needs or computing needs. Currently, in order to create a solid state circuit that can hold an "on" or "off" state or one BIT of data such as a "Flip Flop" circuit requires up to eight or nine components. Also the current state of magnetic induction transmission circuits requires an external switch in order to terminate the magnetic field in the primary coil.

Therefore what is clearly needed is a way to internally turn "off" or "on" the magnetic field in the primary coil without using an external switch for the magnetic induction transmission circuit. The current state of the art can not solely use a magnetic induction circuit as a solid state switch or retain binary data because its incapable of retaining an internal "on" or "off" state in the primary coil on demand. Also the current state of the art for "Flip Flop" circuits requires a need to reduce the amount of required components.

SUMMARY OF THE INVENTION

In one embodiment of the invention an induction memory cell is provided, comprising two photo resistors that receive laser light to change the "on" or "off" state of the magnetic field in the primary coil of the circuit depending on which photo resistor receives the laser light. One 470 ohm resistor prevents the "off" state of the magnetic field in the primary coil from changing unintentionally to a state of "on". The first (8) and second (9) photo resistor is each enclosed in a short non-transparent plastic 0.24" wide×0.5" long tube with one opened end that restricts some ambient light but also allows laser light to reach the photo resistor.

Also in one embodiment an electronic circuit that creates a solid state induction switch that can hold the "on" or "off" state of a magnetic field (alternating current) within the primary coil that can control external devices. Also in one embodiment an electronic circuit that creates a solid state switch that when used in an array can be programmed to retain binary information such as "on" as a binary digit of one or "off" as a binary digit of zero. Also in one embodiment the induction memory cell can act as a solid state switch or retain binary data; which the "on" or "off" state can be set via laser light, wireless induction from another induction memory cell or mechanical switch.

In another aspect of the invention a method for turning "on" or "off" the magnetic field in the primary coil is provided, comprising the steps, (a) laser light is aimed toward the photo resistor (2) connected to the base and emitter of the NPN transistor (1) turns the magnetic field "on" in the primary coil (5), (b) laser light is aimed toward the photo resistor (3) connected to the base and collector of the NPN transistor (1) turns the magnetic field "off" in the primary coil (5).

DETAILED DESCRIPTION OF THE INVENTION

The induction memory cell can be utilized as a switch (flip flop switch) or digital memory device by using a magnetic induction circuit and internally controlling the magnetic field in the primary coil. The typical magnetic induction circuit uses a 1 k resistor, NPN transistor and a coil to create an alternating current in a primary coil to create induction. When the magnetic induction circuit's 1 k resistor is replaced with a 470 ohm resistor, and two photo resistors are attached to the NPN transistor the circuit's function changes.

The magnetic field within the induction memory cell primary coil can be turned "on" or "off" by briefly exposing the photo resistors to laser light for one second. The induction memory cell can store digital binary information or control external devices by acting as a solid state switch. The two photo resistors that turn the magnetic field "off" or "on" are each enclosed in a short non-transparent plastic 0.24" wide×0.5" long tube to shield from ambient light but also allows laser light to reach each photo resistor. The induction memory cell circuit requires a 1.5 volt, 5 amp direct current power source in order to maintain an "on" or "off" switching effect in the primary coil.

Figure 1:
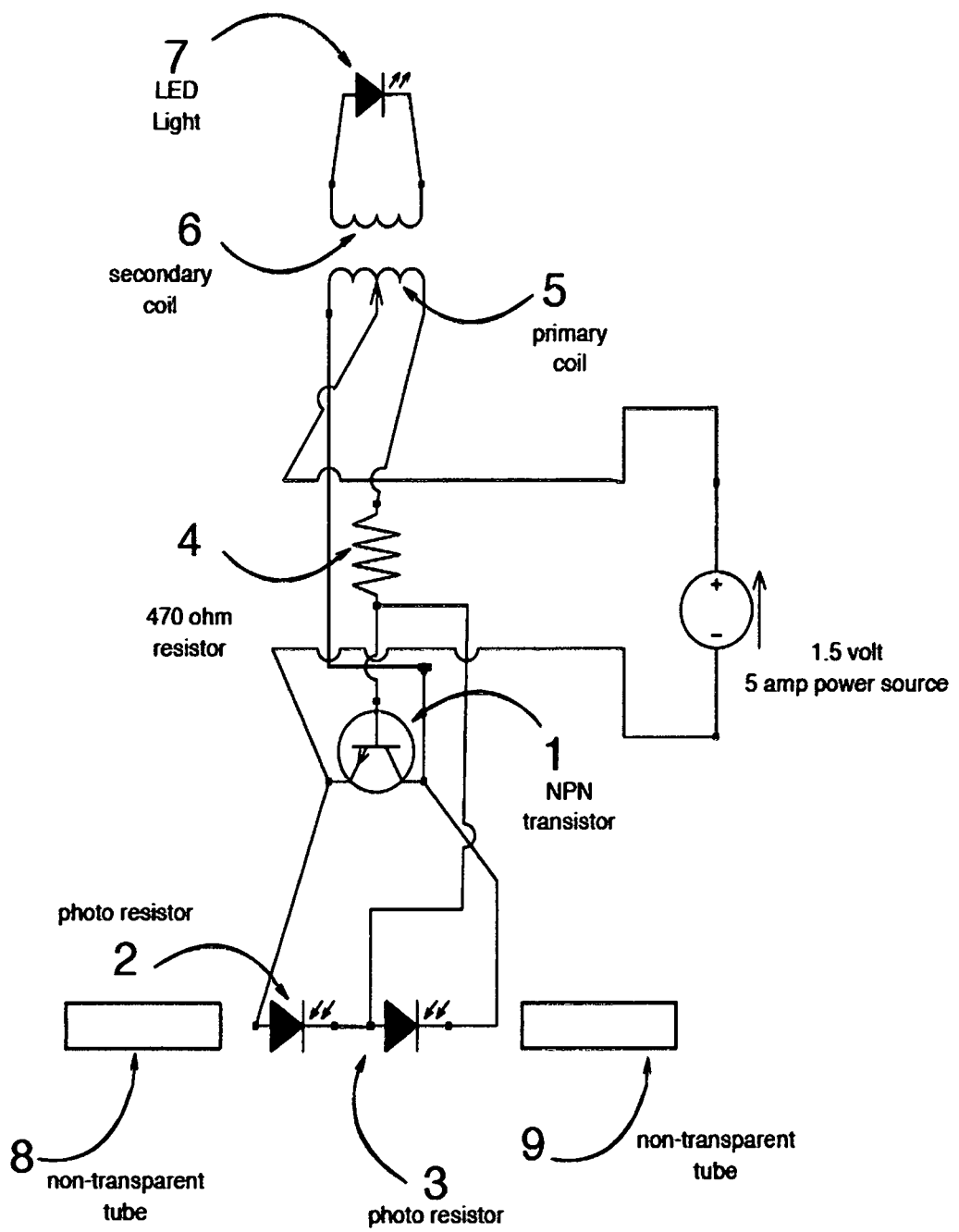
FIG. 1 is a visual description of a single induction memory cell utilizing two photo resistors for setting an "on" or "off" state in the primary coil according to the embodiment of the invention.

FIG. 1 is a visual description of a single induction memory cell utilizing two photo resistor (2,3) inputs for an "on" or "off" state of a primary coil according to the embodiment of the present invention. The induction memory cell consists of a NPN transistor (1), 470 ohm resistor (4), primary coil (5), secondary coil (6), two photo resistors (2,3), LED (7), a non transparent plastic 0.24" wide×0.5" long tube (8) that encloses the first photo resistor (2) connected to the base and the emitter of the NPN transistor (1) and a non transparent plastic 0.24" wide×0.5" long tube (9) that encloses the second photo resistor (3) connected to the base and collector of the NPN transistor (1). Each non-transparent plastic 0.24" wide×0.5" long tube (8)

(9) enclosing a photo resistor (2) (3) has an opened end on one side of the tube to allow laser light to reach the photo resistor (2) (3) but also reduces ambient light. The primary coil (5), 470 ohms resistor (4) and a NPN transistor (1) are configured to create a magnetic induction circuit by creating a magnetic field within the primary coil (5). The primary coil (5) can induce a voltage in the secondary coil (6). The voltage induced within a secondary coil (6) will illuminate a LED (7); which will activate an external photo resistor; which will "close" or "open" a circuit to provide power to an external device. The magnetic field within the primary coil (5) can be turned "on" by a connected photo resistor (2) between the transistor's base and emitter when briefly exposed to laser light. The photo resistor (3) connected to the NPN transistor's (1) base and collector briefly exposed to laser light creates an "off" state within the primary coil (5).

When the magnetic field (alternating current) is present in the primary coil (5) the secondary coil (6) will have an induced voltage; which represents a state of "on" or a binary number of one. When the primary coil (5) no longer contains a magnetic field, represents a state of "off" or a binary number of zero. When a secondary coil (6) is placed over the primary coil (5) in a state of "on" a voltage is induced in the secondary coil 6; which tells the state of the magnetic field of the primary coil (5) which can be connected to an LED (7) light.

Figure 2:
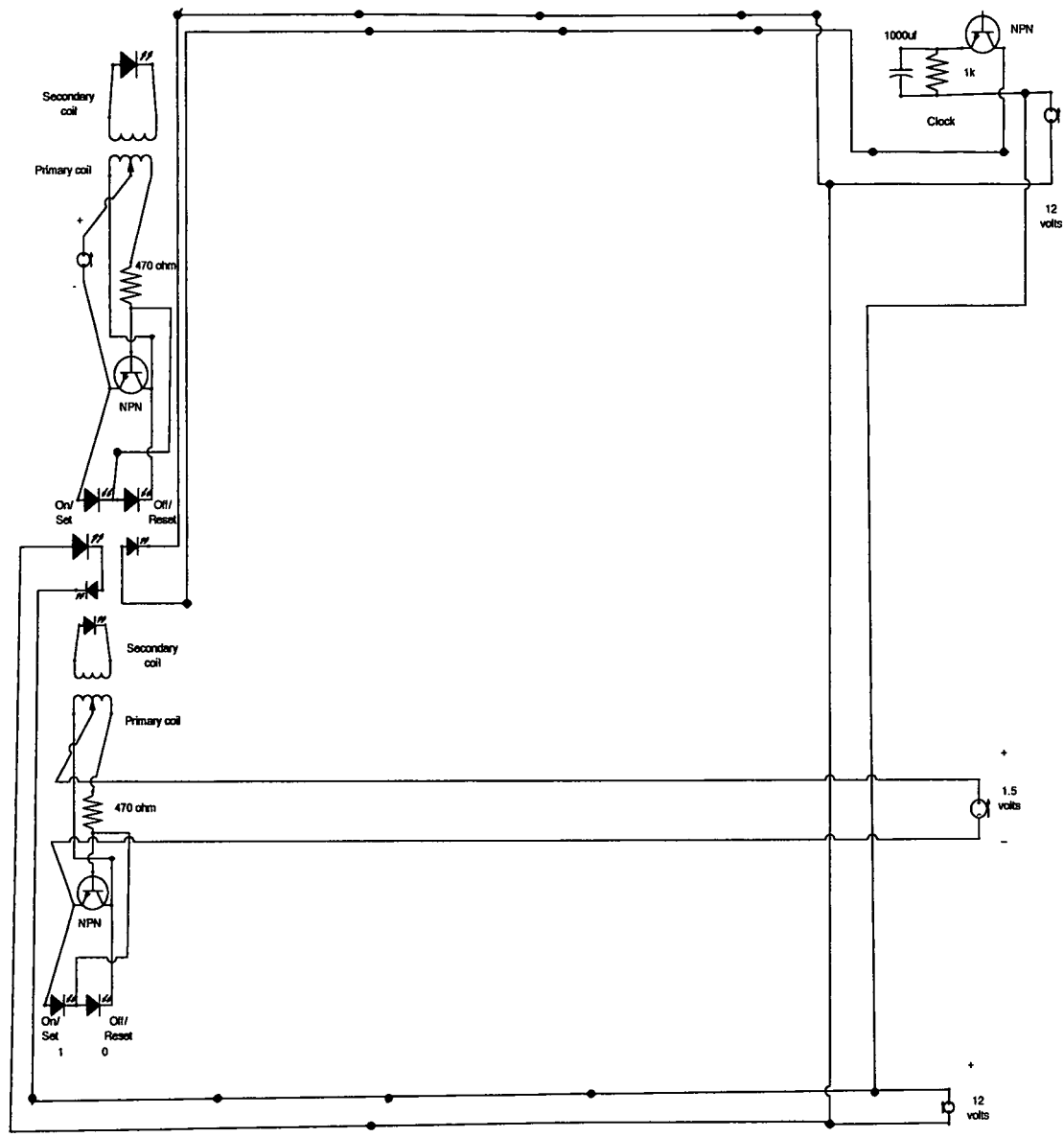
FIG. 2 is a visual description of two induction memory cells in a configuration in which one induction memory cell can change the state of a second induction memory cell according to the embodiment of the invention.
Figure 3:
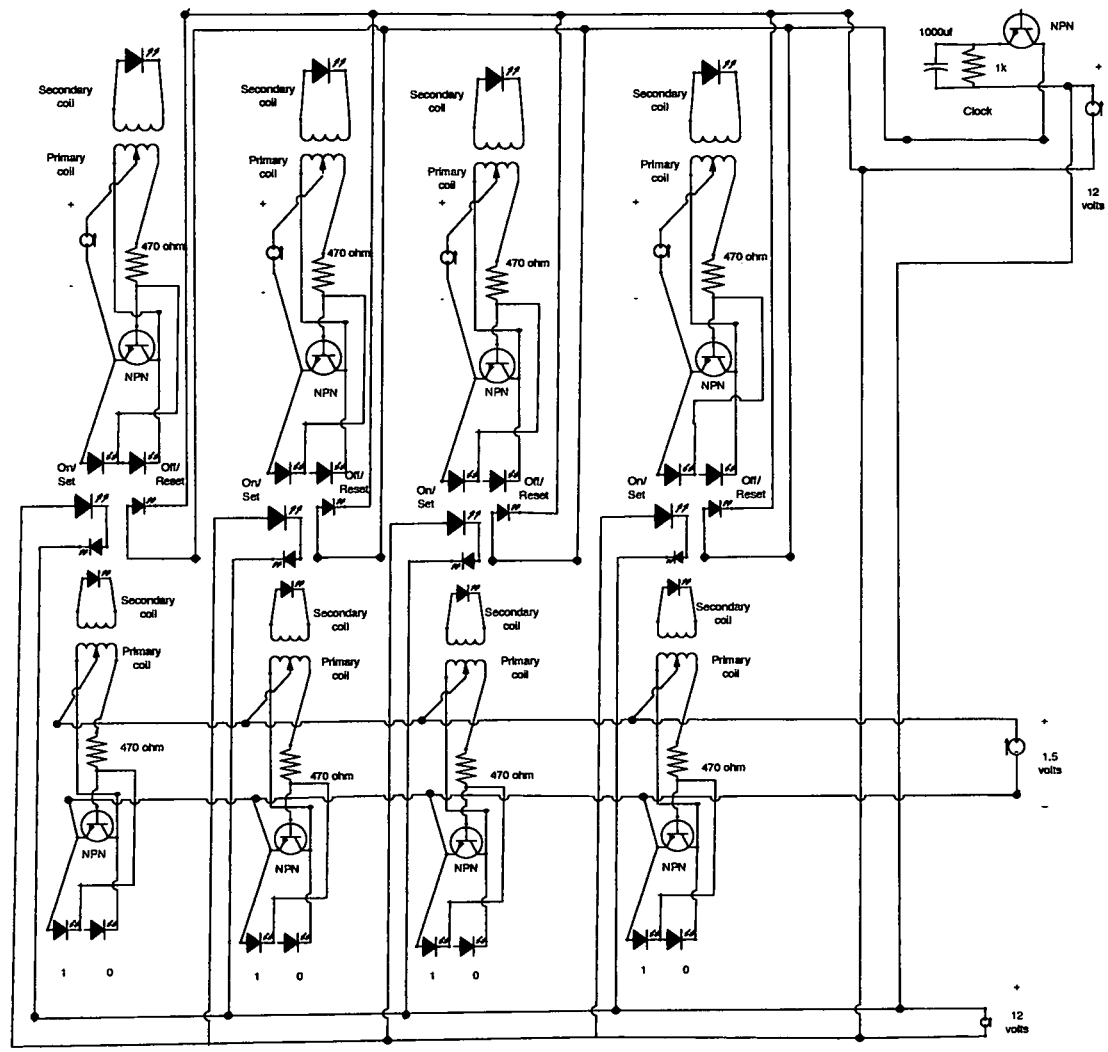
FIG. 3 shows several induction cells configured to demonstrate a 4 BIT memory device; which can be reset and reprogrammed via physical switches or laser light according to the embodiment of the invention.

FIG. 2 is a visual description of two induction memory cells in a configuration; which one induction memory cell can change the state of a second induction memory cell according to the embodiment of the invention. FIG. 2 is a visual example of the wiring and components of a two Induction memory cell circuit. FIG. 3 shows several induction cells configured to demonstrate a 4 BIT memory device; which can be reset and reprogrammed via physical switches or laser light according to the embodiment of the invention. FIG. 3 is just an example of the wiring and components of a 4 BIT induction memory cell circuit.

Figure 4:
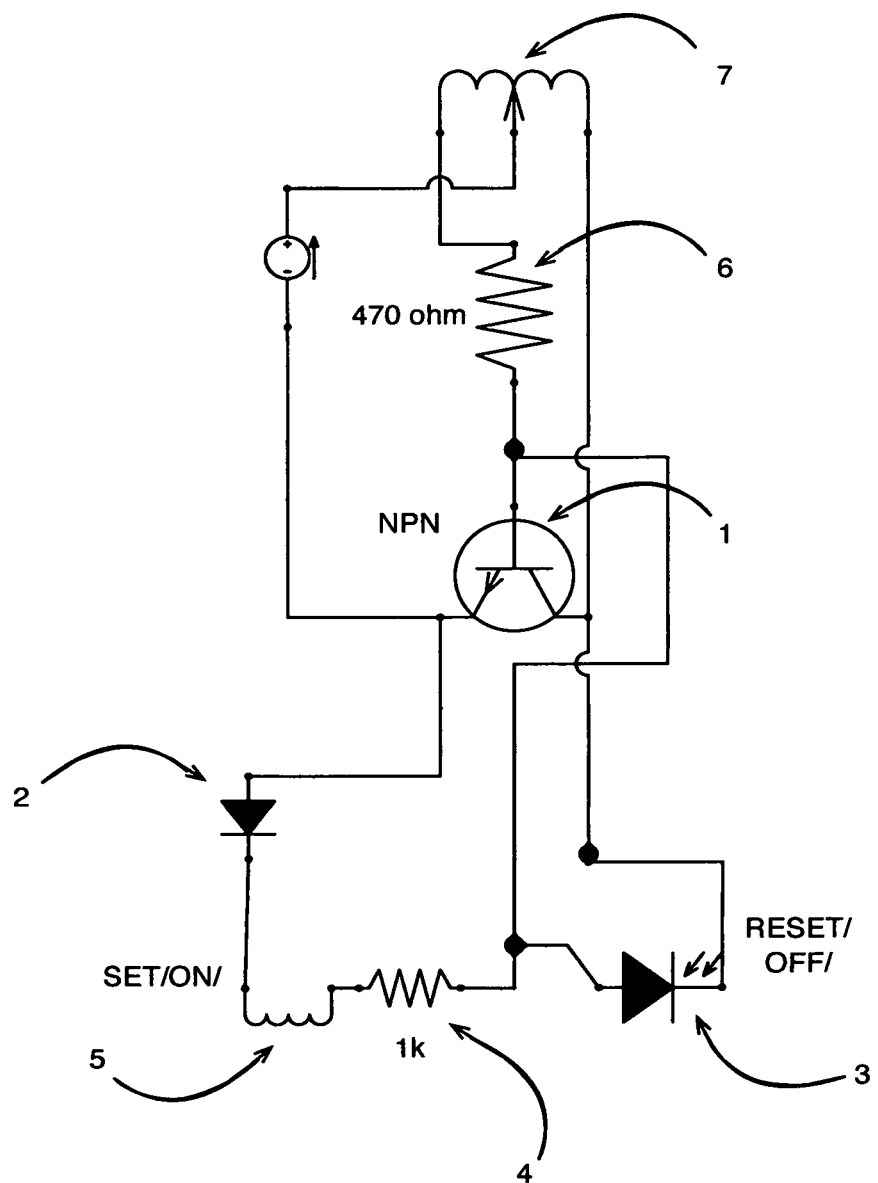
FIG. 4 is an illustration of the induction memory cell which has an extra input coil in order to receive an induction voltage from another induction memory cell that changes the "on" and "off" cell state according to the embodiment of the invention.
Figure 5:
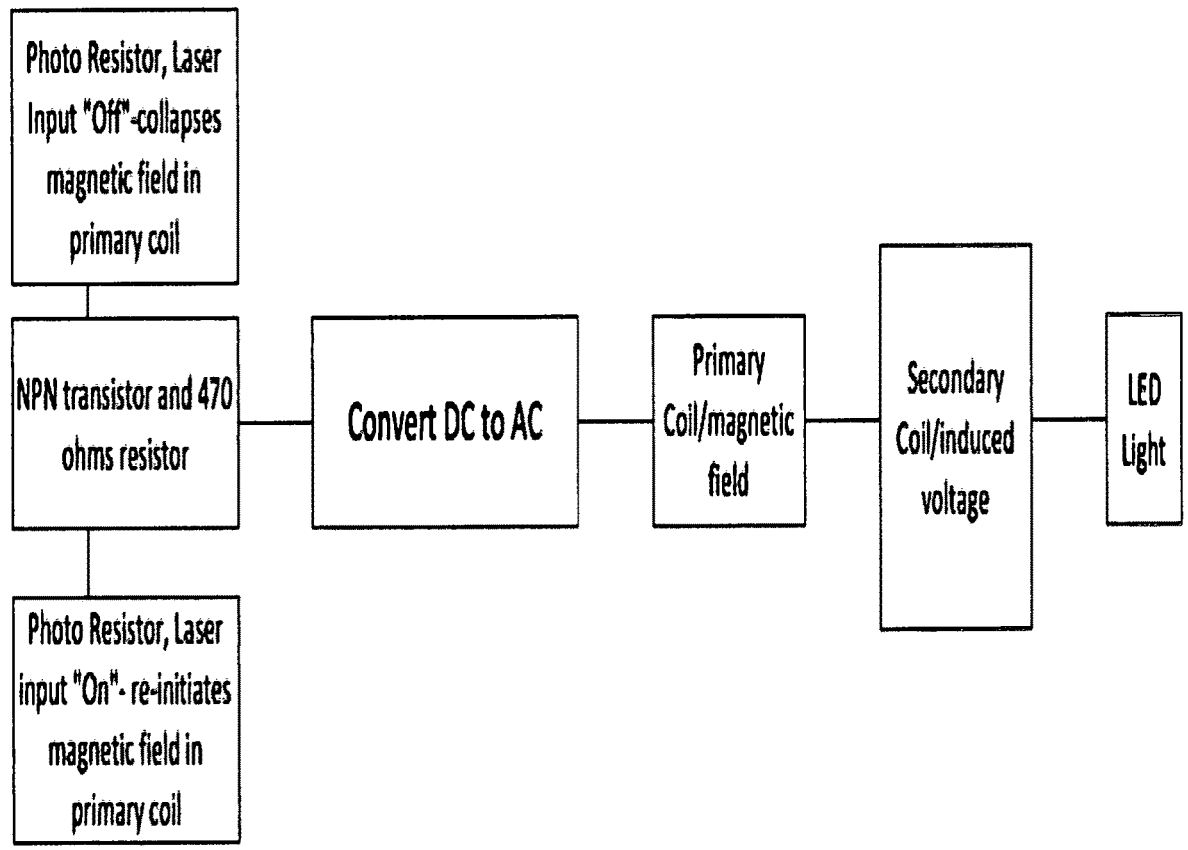
FIG. 5 is a block diagram of how the induction memory cell functions.

FIG. 4 is an illustration of the induction memory cell which has an extra input coil in order to receive an induction signal from another induction memory cell that changes the "on" and "off" cell state according to the embodiment of the invention. FIG. 4 shows a 1 k resistor (4), coil (5) and a diode (2) connected to the base and emitter of the NPN transistor (1). The resistor (4), coil (5) and diode (2) enable the induction memory cell "on" state to be selected via the primary coil of an adjacent induction memory cell. The "off" state is selected via a photo resistor's (3) brief exposure to laser light connected to the NPN transistor's (1) base and collector. FIG. 5 is a block diagram of how the induction memory cell functions. A direct current power source of 1.5 volts at 5 amps is applied to the circuit. The 1.5 volts is converted to alternating current and a magnetic field is created within the primary coil. The first photo resistor (3) exposed to laser light; which is connected to the NPN transistor (1) will terminate the magnetic field in the primary coil (5). The second photo resistor (2) exposed to laser light; which is connected to the NPN transistor (1) will re-initiate or turn on the magnetic field in the primary coil (5). A secondary coil (6) will receive an induced voltage from the primary coil (5); which will turn on a LED light (7); which can be used to control external devices.

What is claimed is:

1. An induction memory cell comprising of:
    a primary coil, a secondary coil, a NPN transistor, a 470 ohm resistor, a first photo resistor connected to a base and a collector of the NPN transistor; and a second photo resistor connected to the base and an emitter of the NPN transistor, in which the first photo resistor receives laser light for one second to terminate a magnetic field in the primary coil; and the second photo resistor receives laser light for one second turns on the magnetic field in the primary coil; in which the primary coil induces a voltage into the secondary coil to control external devices.

2. The induction memory cell of claim 1, wherein the first photo resistor is enclosed in a first non transparent plastic 0.24" wide×0.5" long tube; and the second photo resistor is enclosed in a second non transparent plastic 0.24" wide×0.5" long tube; the first non transparent plastic 0.24" wide×0.5" long tube enclosing the first photo resistor has one opened end to allow laser light to reach the first photo resistor but reduces ambient light; and the second non transparent plastic 0.24" wide×0.5" long tube enclosing the second photo resistor has one opened end to allow laser light to reach the second photo resistor but reduces ambient light.

3. A method for turning "on" or "off" a magnetic field in a primary coil, Laser light is aimed towards a first photo resistor for one second that is connected to a base and a collector of a NPN transistor that turns the magnetic field "off" in the primary coil or laser light is aimed at a second photo resistor for one second that is connected to the base and an emitter of the NPN transistor that turns the magnetic field "on" in the primary coil.

* * * * *